United States Patent
Wang et al.

(10) Patent No.: US 8,294,212 B2
(45) Date of Patent: Oct. 23, 2012

(54) METHODS AND APPARATUS FOR SRAM BIT CELL WITH LOW STANDBY CURRENT, LOW SUPPLY VOLTAGE AND HIGH SPEED

(75) Inventors: Ping-Wei Wang, Hsin-Chu (TW); Chang-Ta Yang, Hsin-Chu (TW); Yuh-Jier Mii, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 211 days.

(21) Appl. No.: 12/748,098

(22) Filed: Mar. 26, 2010

(65) Prior Publication Data

US 2011/0068400 A1 Mar. 24, 2011

Related U.S. Application Data

(60) Provisional application No. 61/243,941, filed on Sep. 18, 2009.

(51) Int. Cl.
*H01L 27/12* (2006.01)
*H01L 21/70* (2006.01)

(52) U.S. Cl. ............... 257/347; 257/390; 257/E29.255; 257/E27.112

(58) Field of Classification Search .................... None
See application file for complete search history.

(56) References Cited

U.S. PATENT DOCUMENTS

2006/0275962 A1* 12/2006 Lee .............................. 438/152
2008/0181034 A1* 7/2008 Hunter et al. ................. 365/200

OTHER PUBLICATIONS

Chang, L. et al., "Stable SRAM Cell Design for the 32 nm Node and Beyond", 2005 Symposium on VLSI Technology Digest of Technical Papers, pp. 128-129.

* cited by examiner

*Primary Examiner* — Fernando L Toledo
*Assistant Examiner* — Valerie N Brown`
(74) *Attorney, Agent, or Firm* — Slater & Matsil, L.L.P.

(57) ABSTRACT

Circuits and methods for providing an SRAM or CAM bit cell. In one embodiment, a bit cell portion with thicker gate oxides in the storage cell transistors, and thinner gate oxides in a read port section having transistors are disclosed. The use of the thick gate oxides in the storage cell transistors provides a stable storage of data and lower standby leakage current. The use of the thinner gate oxides in the read port transistors provides fast read accesses and allows a lower Vcc,min in the read port. The methods used to form the dual gate oxide thickness SRAM cells have process steps compatible with the existing semiconductor manufacturing processes. Embodiments using high k gate dielectrics, dual gate dielectric materials in a single bit cell, and using finFET and planar devices in a bit cell are described. Methods for forming the structures are disclosed.

18 Claims, 19 Drawing Sheets

METHODS AND APPARATUS FOR SRAM BIT CELL WITH LOW STANDBY CURRENT, LOW SUPPLY VOLTAGE AND HIGH SPEED

This application claims the benefit of U.S. Provisional Application No. 61/243,941, filed on Sep. 18, 2009, entitled "Methods and Apparatus for SRAM Bit Cell with Low Standby Current, Low Supply Voltage and High Speed,", which is hereby incorporated in its entirety herein.

RELATED APPLICATIONS

This application relates to co-pending and co-owned U.S. Provisional Patent Application Ser. No. 61/243,896, entitled "Embedded SRAM Memory for Low Power Applications", which was filed on Sep. 18, 2009, and which is hereby incorporated by reference in its entirety herein.

TECHNICAL FIELD

The present invention relates to an SRAM memory bit cell structure and methods for providing a bit cell with improved standby leakage current (Isb) for improved standby operation, improved Vcc,min power for lowered supply levels, and high speed read access times. The bit cell includes an innovative layout and multiple gate oxide thicknesses within cell transistors. The use of the invention provides advantages in an SRAM for use in an integrated circuit having logic circuitry and user specified circuitry thereon, in addition to the SRAM array of SRAM bit cells, the SRAM cells having improved stability and providing reliable operation over a wide range of conditions. Methods for making the SRAM bit cells incorporating the features of the invention are compatible with existing state of the art and planned semiconductor processes.

BACKGROUND

A current common requirement for an electronic circuit and particularly for electronic circuits manufactured as integrated circuits in semiconductor processes is an on-board or embedded array of memory storage elements. These elements may be provided as dynamic random access memory (DRAM) cells and alternatively as static random access memory cells (SRAM) cells. DRAM and SRAM memories are described as "volatile" memory cells, in that if the power to the integrated circuit device is removed, the stored data will be lost. DRAM cells may be provided in very dense arrays, since a DRAM cell requires only a single access transistor and a storage capacitor; however, DRAM circuits have relatively slow access time for reads and writes, and require somewhat complicated control circuitry, and each DRAM cell stores data as charge on a leaky capacitor, so that the DRAM array must be refreshed periodically to maintain state. This requires either that processors periodically stop other operations and perform the refresh cycles, or that a dedicated memory controller (more often used in recently produced devices) perform the refresh cycles. SRAM arrays require more silicon area, since each bit cell is a latch formed of typically six transistors (6T) or more; however, the SRAM cells will retain data so long as a supply voltage is present. Further advantages are that access times are very fast compared to DRAM cells, making SRAM cells particularly attractive as scratchpad or working data storage, such as cache memory for processor. Recent system on a chip (SOC) designs often incorporate one or more "cores". These cores are often predesigned popular processors such as DSPs, ARMs, RISC or microprocessors, arranged with a level one (L1) cache memory of SRAM cells laid out near or adjacent to the processor to make very fast processing operations possible.

Increasingly, integrated circuits are used to implement functions in battery operated devices. For example, SOCs may be used to provide all or most of the circuitry needed to implement the main functions of a cellphone, laptop computer, netbook computer, audio or video player, camcorder or camera, smartphone or PDA. In these devices, customer defined logic or licensed processor core designs may be integrated with other predefined or macro cells such as microprocessors, digital signal processors, cores such as ARM, RISC or similar core functions, cell phone modules, and the like.

In an SRAM bit cell, data is stored on two storage nodes which are inversely related. A pair of CMOS inverters, formed of four MOS transistors, is arranged as a latch cell, each storage node being formed of the gate terminals of two MOS transistors and receiving the output of an inverter formed of two MOS transistors in complementary MOS (CMOS) technology.

FIG. 1 depicts a typical SRAM bit cell 10 in a 6T arrangement. In FIG. 1, a pair of MOS pass gates PG1 and PG2 couple a pair of data lines referred to as "bit lines" BL and BLB to storage nodes SN1 and SN2, respectively. The pass gate transistors PG1 and PG2 are typically formed of NMOS transistors as is known in the art. A positive supply voltage Vdd, which may be from 0.6 Volts to 3.0 or more volts, depending on the technology, is shown. Pull up transistors PU1 and PU2 are formed of PMOS transistors and couple the positive supply to one or the other storage nodes, depending on the state of the SRAM cell 10. A second supply voltage Vss, usually placed at ground, is shown.

Two pull down transistors PD1 and PD2, which are also NMOS transistors, couple this negative or ground voltage Vss to one or the other storage node labeled SN1 and SN2, depending on the state of the bit cell. The bit cell is a latch that will retain its data state indefinitely so long as the supplied power is sufficient to operate the circuit correctly. Two CMOS inverters formed of PU1, PD1 and PU2, PD2 are "cross coupled" and they operate to reinforce the stored charge on the storage nodes SN1 and SN2 continuously. The two storage nodes are inverted one from the other, as shown in the figure. When SN1 is a logical "1", usually a high voltage, SN2 is at the same time a logical "0", usually a low voltage, and vice versa.

When SRAM bit cell 10 is written to, complementary write data signals are placed on the bit line pair BL and BLB. A positive control signal on a wordline WL is coupled to the gate of both pass gates PG1 and PG2. The transistors PU1, PD1 and PU2, PD2 are sized such that the data on the bit lines may overwrite the stored data and thus write the SRAM bit cell 10.

When the SRAM bit cell 10 is read from, a positive voltage is placed on the word line WL, and the pass gates PG1 and PG2 allow the bit lines BL and BLB to be coupled to, and receive the data from, the storage nodes SN1 and SN2. Unlike a dynamic memory cell, the SRAM bit cell does not lose its stored state during a read if the power supply Vdd is maintained at a sufficiently high level, so no "write back" operation is required after a read.

The bit lines BL and BLB form a complementary pair of data lines. As is known to those skilled in the art, these paired data lines may be coupled to a differential sense amplifier (not shown); the differential voltage can be sensed and amplified, as is known in the art. This amplified sensed output signal may then be output as data to other logic circuitry in the device.

FIG. 2 depicts another form of a conventional SRAM bit cell 12 that uses 8 transistors (8T) and has an additional functionality in the form of a read port 14. In FIG. 2, the 6T cell 10 such as is shown in FIG. 1 is used. SRAM bit cell 12 additionally has a read port 14 of two NMOS transistors, read port pull down transistor RPD and read port pass gate transistor RPG. A read word line (RWL) is provided that is dedicated to "reads" only. The previous word line WL in FIG. 1 now becomes a write only word line WWL in the 8T cell 12 of FIG. 2. Advantages of a separate read port are that the possibility of "read disturbs" is reduced, because the data stored in the bit cell affected by the read operations; instead, the read pull down transistor RPD is either on or off based on the storage node SN2 voltage that is coupled to the gate terminal of the transistor RPD. Because an NMOS transistor has gain, the stored data signal at SN2 is amplified by the gain of transistor RPD; and when the read word line RWL has a positive voltage placed on it, read pass gate transistor RPG turns on and couples the read bit line RBL to the read pull down transistor RPD, and the read port therefore outputs a corresponding data bit on the read bit line RBL. In many applications, SRAM arrays of many bit cells are used that store data or programs for retrieval and use later. The SRAM cells may experience many more read operations than write operations in the same time period. Thus, it is very advantageous to have the read operations isolated from the bit cell by the read port circuit 14. This is true even though the 8T cell uses slightly more layout area in silicon to implement it. Further, when attempting to save power, the Vcc,min characteristic measurement becomes much more critical for the read circuitry, as that is the portion of the circuitry that is active most often.

FIG. 3 depicts another known SRAM bit cell 20 arrangement that uses ten transistors (10T). In this form, the circuit has two read ports, one coupled to each storage node SN1 and SN2 of the 6T cell 10. Each read port 22 and 24 has a separate control line (RWL1 and RWL2) and a separate pull down NMOS transistor and pass gate NMOS transistor. The two read bit lines RBL1 and RBL2 are coupled by the pass gate transistors RPG1, RPG2 to the pull down transistors RPD1 and RPD2 respectively. The pull down transistors each have a gate terminal coupled a respective storage node SN1 and SN2. The read operations may be performed independently or simultaneously. The use of the two read ports provides additional flexibility and allows two outputs to be read from the cell simultaneously.

The continuing and increasing demand for low power integrated circuits, particularly for more complicated battery powered, portable devices, requires that SRAM cells have good power consumption characteristics. One measure of the power consumption is the standby leakage current (hereinafter, "Isb"). When the SRAM cell is not being used, the SRAM array may be placed in a standby mode. The leakage current consumed during standby, Isb, should be minimized. Further, it is known in the art to reduce power consumed in CMOS circuitry during standby mode by reducing the positive power supply as far as possible while operating reliably. The metric used to determine this Vcc potential is referred to as "Vcc, min.". It is clearly advantageous to provide SRAM cells with a low Vcc,min value. This is difficult to do reliably for the 6T storage cells, however, due to process variations and other constraints increasingly imposed by shrinking device sizes and process advances.

However, the circuits must also have excellent access time (read speed) and operate reliably without "read disturb" errors. This last characteristic may be described as the stability of the circuit. One method for maintaining stability is to decrease the Vcc,min to the SRAM storage cells. Further, as semiconductor processes continue to advance, device sizes continue to shrink. The use of smaller and smaller devices results in devices with increasingly broad performance variation. In order to maintain reliable operation with such devices, a lower Vcc,min is required. While lowering Vcc,min is a good approach to lower power consumption, lowering Vcc, min in the SRAM array is also desirable.

Thus, there is a continuing need for an improved SRAM bit cell structure that has a lower standby leakage current Isb, improved Vcc,min for lower standby power, and improved access speed particularly during read operations, while remaining compatible with state of the art semiconductor processes for fabricating integrated circuits, without adding significant steps or significant added costs.

SUMMARY OF THE INVENTION

These and other problems are generally solved or circumvented, and technical advantages are generally achieved by embodiments of the present invention, which provides in exemplary embodiments an SRAM bit cell with thicker gate oxides in the storage cell transistors and thinner gate oxides in the read port transistors. The use of the thicker gate oxides in the storage cell transistors provides a stable storage of data, and lower standby current. The use of the thinner gate oxides in the read port transistors provides fast read accesses and allows a lower Vcc,min. The power supplied to the read port may be coupled to a logic portion of the device, while the power to the storage cell transistors may be higher for improved reliability. The methods are arranged to form the dual gate oxide thickness SRAM cells with process steps that are compatible with the existing process flows used in semiconductor manufacturing.

In an exemplary embodiment, an apparatus comprising a semiconductor substrate, and at least one SRAM bit cell formed in a portion of the semiconductor substrate is provided. The at least one SRAM bit cell further comprises transistors having a first gate dielectric thickness and additional transistors having a second thinner gate dielectric thickness wherein the second thinner gate dielectric thickness is greater than 75% and less than 99% of the first gate dielectric thickness.

In another exemplary embodiment, an integrated circuit is provided, comprising a logic portion formed in a first portion of a semiconductor substrate and having transistors, including some transistors having gate dielectrics of a thin gate dielectric; and an SRAM array. The SRAM further comprises a plurality of SRAM bit cells, each comprising an SRAM bit cell formed in a second portion of the semiconductor substrate; the SRAM bit cell further comprising transistors having a thicker gate dielectric, and additional transistors coupled to the thicker gate dielectric transistors and having the thin gate dielectric; wherein the thin gate dielectric has a thickness that is less than 95% of the thickness of the thicker gate dielectric.

In another exemplary embodiment, an apparatus is provided comprising a semiconductor substrate. At least one content addressable memory (CAM) bit cell is formed in a portion of the semiconductor substrate; wherein the CAM bit cell further comprises transistors having a first gate dielectric of a first thickness and additional transistors having a second thinner gate dielectric; and wherein the second thinner gate dielectric has a thickness greater than 75% and less than 99% of the first gate dielectric thickness.

This summary gives an overview of certain embodiments of the invention, and is not limiting. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
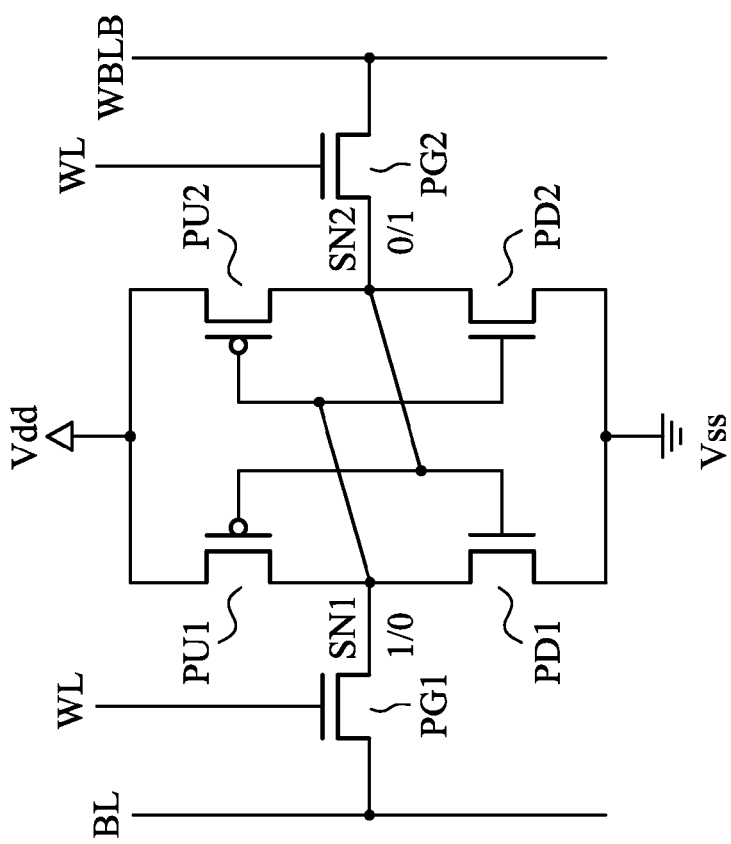
FIG. 1 illustrates a prior art SRAM bit cell circuit.
Figure 2:
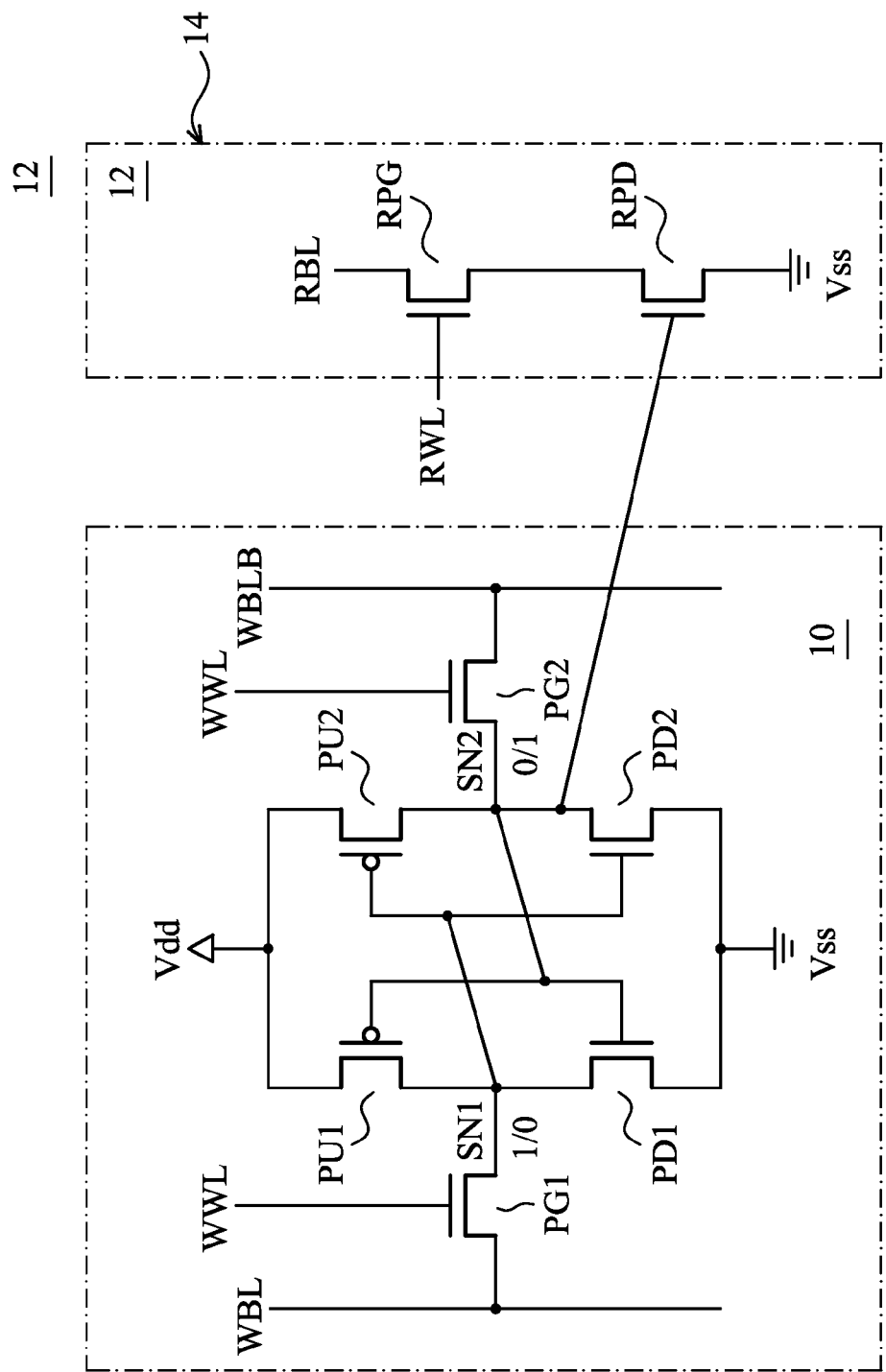
FIG. 2 illustrates a prior art 8T SRAM bit cell circuit.
Figure 3:
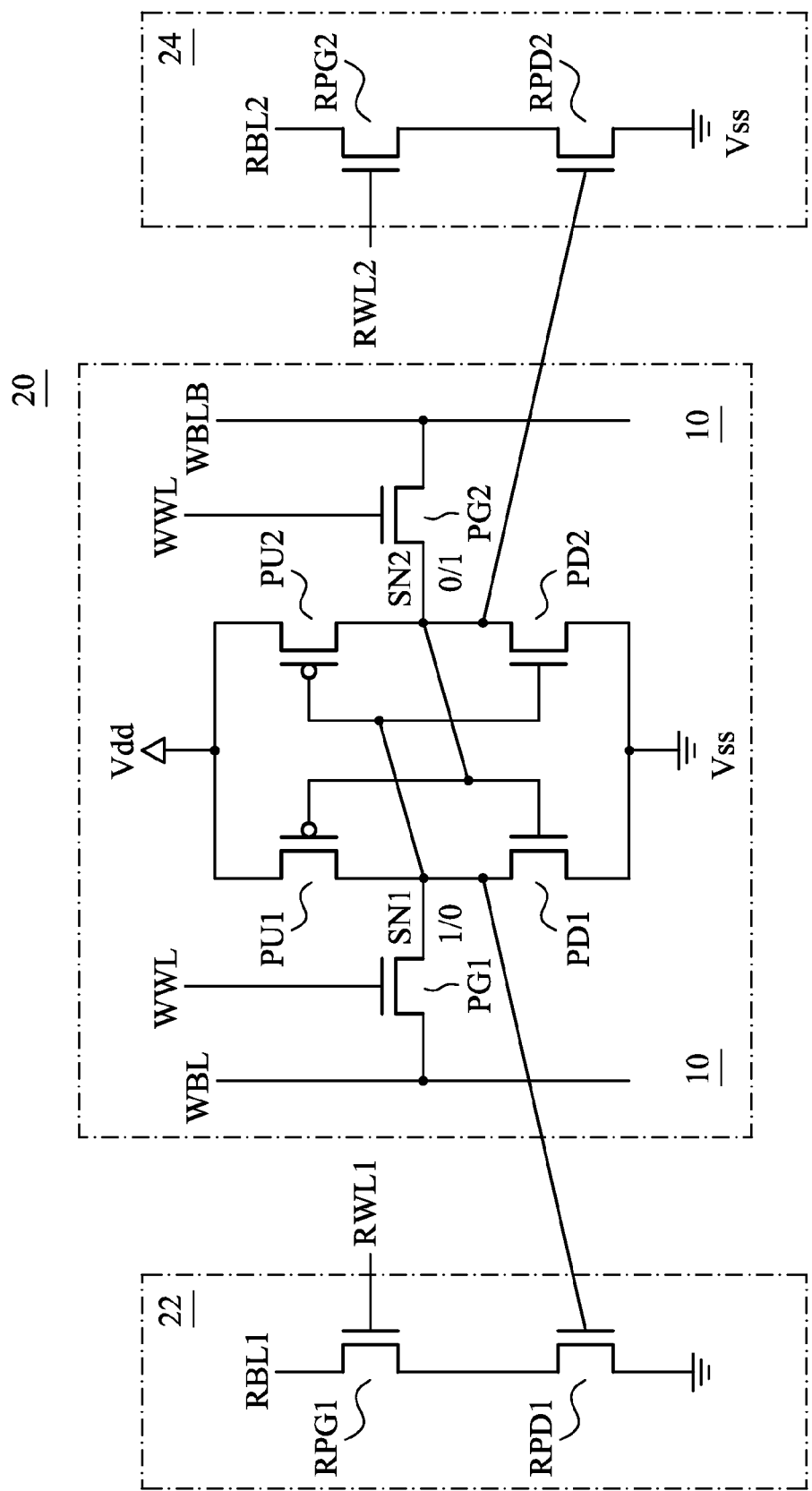
FIG. 3 illustrates a prior art 10T SRAM bit cell circuit.
Figure 4:
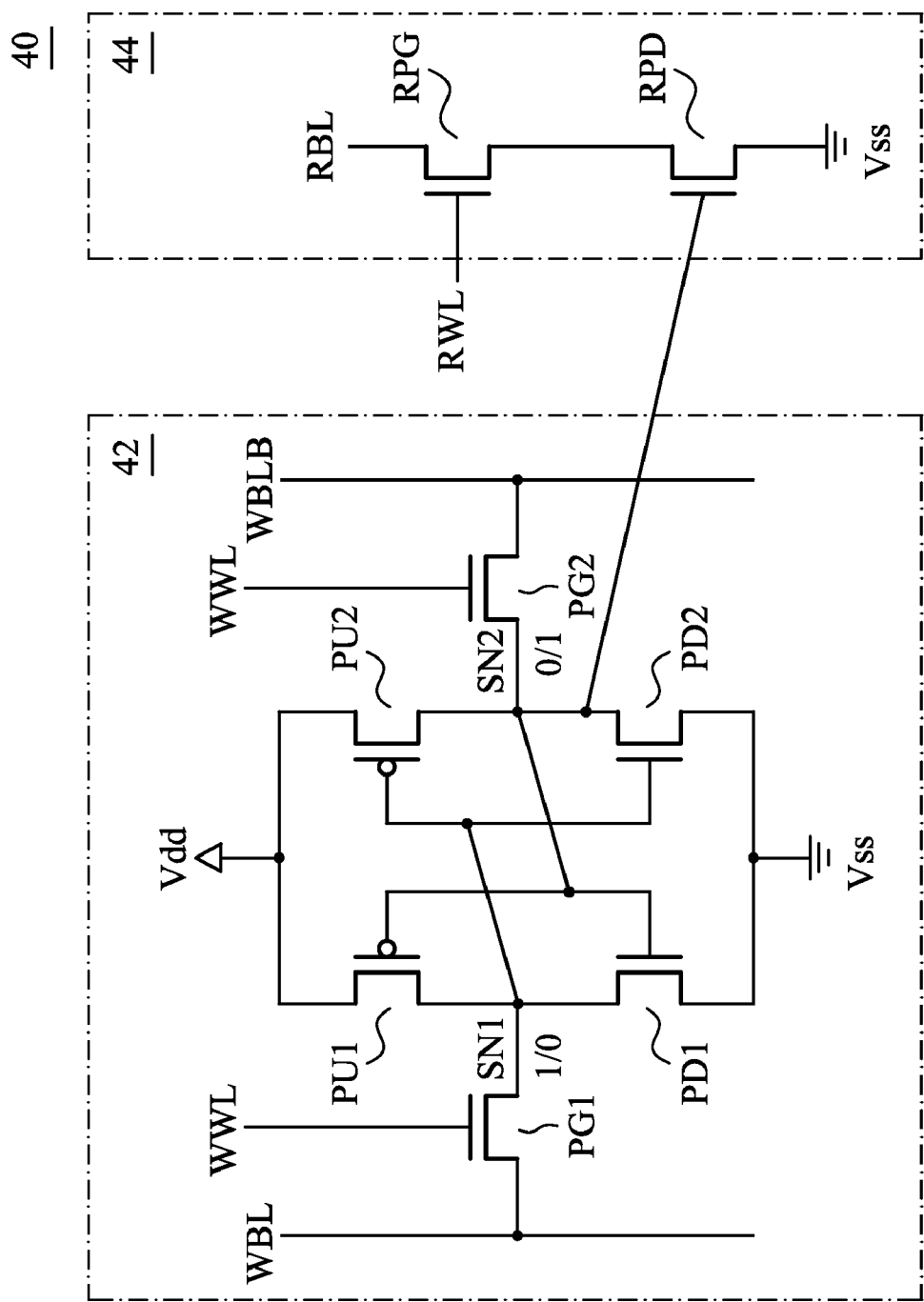
FIG. 4 illustrates the circuit diagram of an exemplary embodiment in an 8T SRAM circuit incorporating features of the invention.

FIG. 4 depicts in one exemplary embodiment a circuit view of an 8T SRAM bit cell 40 incorporating the dual gate oxide features of the invention. In FIG. 4, the 6T storage cell portion 42 has two PMOS pull up transistors PU1 and PU2 as shown in FIGS. 1, 2 and 3; and four NMOS transistors PG1 and PG2, PD1, and PD2 also as shown in the above referenced figures. In this embodiment, however, a thicker gate dielectric is used to form the four NMOS transistors. By using a thicker gate dielectric, the standby current Isb for the SRAM storage cell portion 42 is reduced and stability is improved. For the read port portion 44 of the 8T SRAM bit cell, in contrast, a thinner gate oxide dielectric is used. This thinner gate dielectric results in faster performance and a lower Vcc,min; in fact in an integrated circuit with a logic core portion, the read portion 44 may be fabricated along with and using the thinner gate dielectric and power from the logic portion. The NMOS read port transistors RPG and RPD thus have a faster response time for faster read cycles, and allow a lower Vcc,min for lower power consumption during read operations.

The gate dielectrics may be conventional ones such as silicon oxide, silicon dioxide, silicon nitride, silicon oxynitride and other silicon containing dielectrics as is known in the art. High-k gate dielectrics may be used. For example in some embodiments of the present invention dielectrics including hafnium, zirconium, with or without silicate and oxygen, may be used. The ratio of the thinner gate dielectric layer thickness in the storage cell portion 42 to the thicker gate dielectric layer thickness in portion 44 may be from 0.75 to 0.99, more preferably from 0.85-0.95, and more preferably still from 0.85-0.90. In one non-limiting example, the thicker gate dielectric was formed of silicon dioxide gate dielectric in a 45 nanometer semiconductor process. A gate dielectric thickness of 2.43 nanometers was formed by thermal oxidation in this non-limiting example, but the invention applies to any semiconductor process and is advantageous in the present and planned processes of 45 nanometers, 28 nanometers, 22 nanometers and even smaller feature sizes.

In exemplary embodiments of the SRAM bit cell, the layout style of the SRAM bit cell is also altered in order to achieve further advantages of the features of the dual gate oxide thicknesses of the invention.

Figure 5:
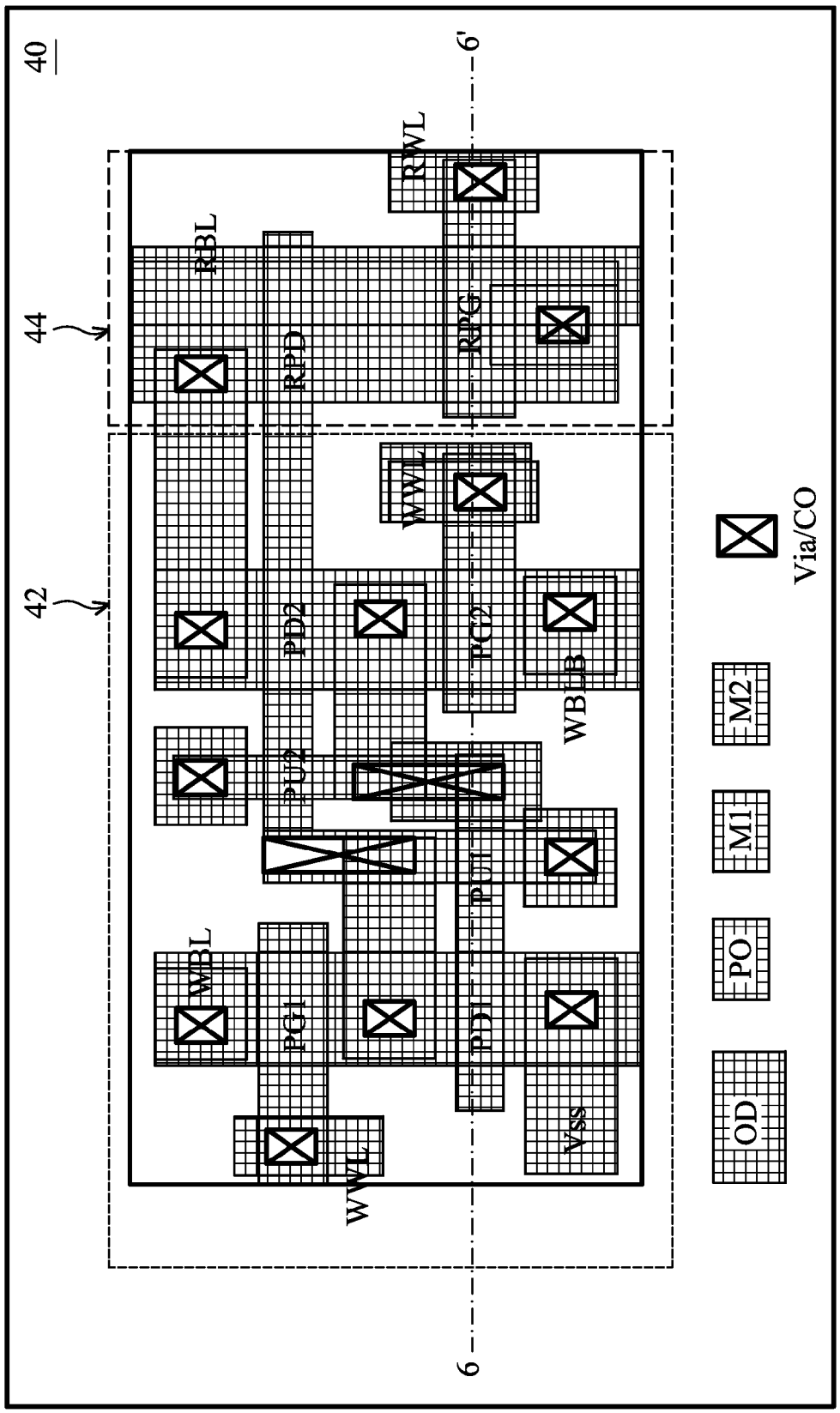
FIG. 5 illustrates in a plan view a layout for an 8T SRAM circuit formed using conventional gate dielectrics.

In order to describe these advantages, first a conventional bit cell layout with a single gate dielectric layer thickness is shown. FIG. 5 depicts in a plan view a layout portion of an SRAM 8T bit cell 40 implemented with a constant gate dielectric thickness using a conventional approach. In FIG. 5, the active areas, formed between isolation regions which may be, for example, shallow trench isolation (STI) or LOCOS isolation, are shown as "OD". As is known to those skilled in the art, the active regions include diffusions that extend into the semiconductor substrate and may be doped to form n or p type regions and lightly doped drain regions, the active regions may also contain additional implants to form source and drain regions, for example. The active region may be in the surface of a semiconductor wafer or in a layer of silicon epitaxially formed over an insulator (SOI). Transistors are formed in the bit cell area using gate conductors deposited and patterned over dielectric material overlying the active areas. The gate dielectrics are not visible in this view, but the polysilicon gates are shown as "PO". The completed transistors are interconnected using the PO layer to couple common gate terminals together, and metal 1 layers are used. These are shown as "M1". In this embodiment, metal 2 layers are also used; these are shown as "M2" using shading to differentiate these areas according to the shading key in FIG. 5. Each of the transistors of FIG. 2, for example, is formed on the silicon substrate. The active areas OD form the source and drain regions of the MOS transistors. The storage cell transistors PG1 and PG2, PU1, PU2, PD1, and PD2 are shown forming a 6T SRAM bit cell layout. The read port transistors RPD and RPG are shown to the right and form the read port circuit of FIG. 2.

Figure 6:
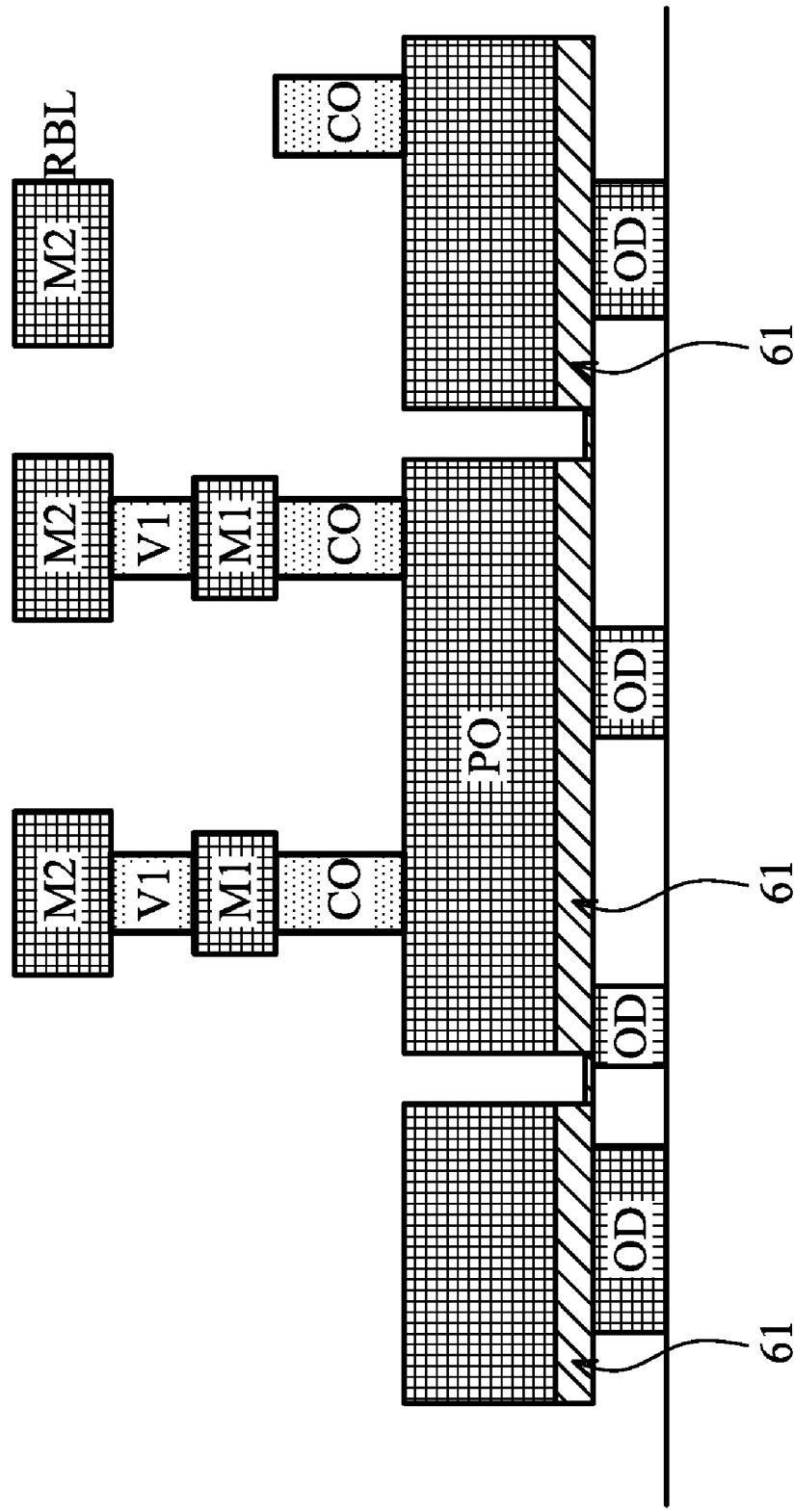
FIG. 6 illustrates a cross-section taken in the plan view of FIG. 5.

FIG. 6 depicts a cross-sectional view taken on the line labeled 6-6' in FIG. 5. The active areas OD are shown spaced apart by isolation regions, with a gate dielectric 61 overlying the active areas beneath the transistor gate polysilicon PO. In the conventional cross-section of FIG. 6, the gate dielectric 61 is the same thickness throughout the read portion and the 6T storage cell. Contacts labeled CO are formed and couple the metal layer 1 portion M1 to the polysilicon. The metal layers are isolated from the polysilicon and each other by one or more layers of inter-level dielectric (ILD, not shown) that forms an insulator. Again oxides, nitrides, oxynitrides and carbon containing interlevel dielectrics may be used. The metal layers M1 and M2 may be formed of aluminum using deposition techniques, or of alloys of aluminum, or of copper and its alloys. When copper or an alloy of copper is used, single damascene and/or dual damascene and CMP techniques may be used to form the conductors as is known in the art. Liner materials, so called BARC and ARC layers and multiple layer interlevel dielectrics may all be used to form the metal layers and the intervening isolation layers, as is known in the art.

A metal 2 read bit line labeled RBL is shown overlying the read portion of the 8T bit cell. As arranged in this conventional layout, metal 2, a via (V1 for vias over metal 1), a metal 1 portion M1, and a contact CO are all required to couple the read bit line RBL to the bit cell.

Figure 7:
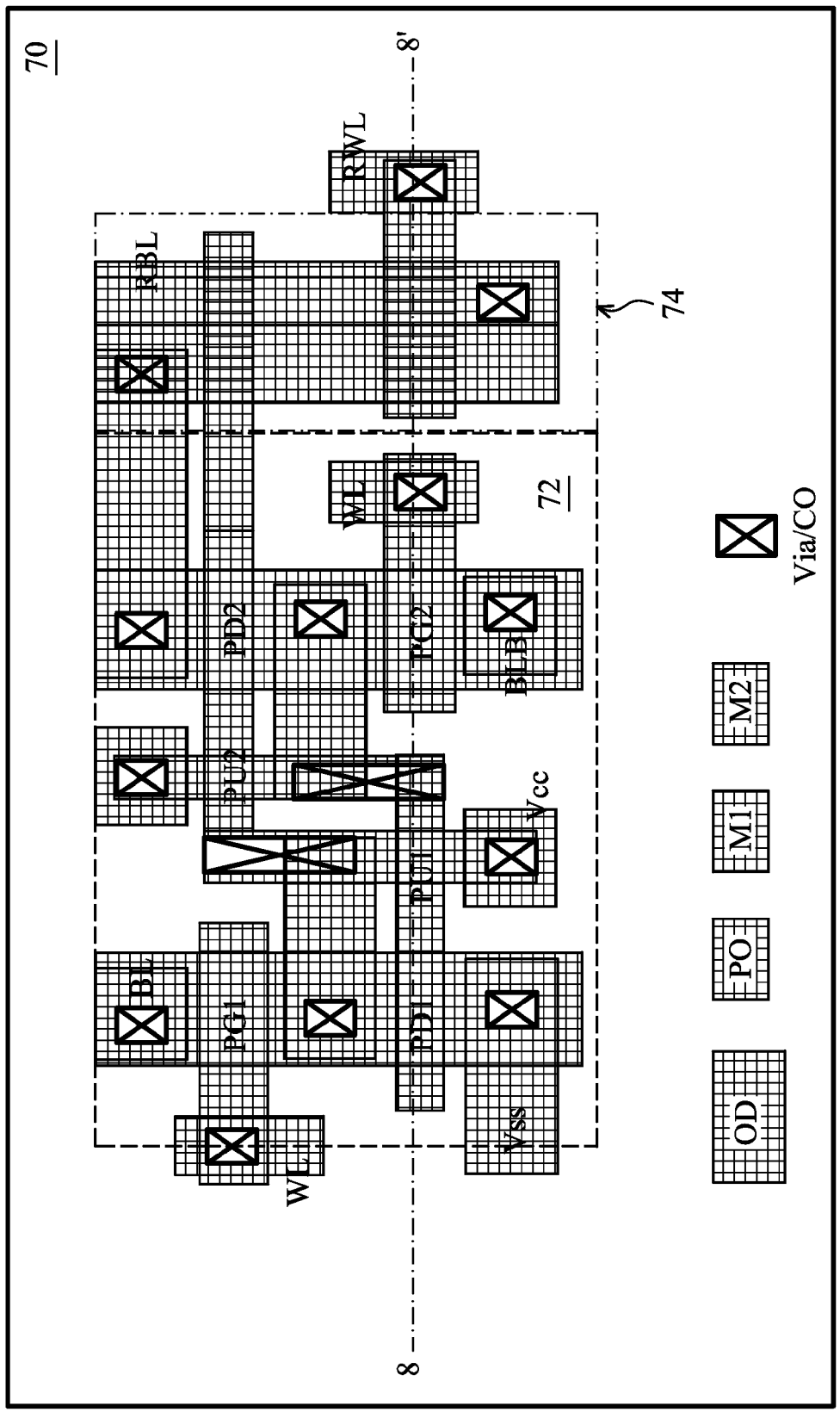
FIG. 7 illustrates in a plan view a layout for an exemplary embodiment, an 8T SRAM circuit formed using the dual gate dielectrics of the invention.

FIG. 7 depicts a layout for an exemplary, nonlimiting, 8T bit cell embodiment 70 incorporating features of the present invention. In FIG. 7, a plan view is depicted of one non-limiting layout arrangement for the circuit embodiment of FIG. 4. Other layouts may be used and these alternatives are contemplated as additional embodiments of the invention. In FIG. 7, a 6T storage cell 72 is shown laid out with active areas formed in the OD layer, defined by isolation regions such as STI. The transistor gates are formed of polysilicon and overlie the gate dielectric, which is not visible in this view. Again, NMOS transistors PG1, PD1, PD2, and PG2 are shown coupled to two PMOS pull-up transistors PU1 and PU2. The read portion 74 of the cell is shown placed adjacent to and electrically coupled to the 6T cell 72, as the circuit diagram in FIG. 4 provides. The two NMOS transistors in the read portion are the read pull down RPD and the read pass gate RPG, both NMOS transistors.

In addition to the use of two different thickness gate dielectrics, the thicker gate dielectric in the NMOS transistors of the 6T storage cell 72, and the thinner gate dielectric being used to implement the read port NMOS transistors in read portion 74, the embodiment layout of the cell depicted in FIG. 7 also includes an improved read bit line structure. In this embodiment, the read bit line RBL is formed on the layer of metal 1, shown as M1. As will be described further below, by restricting the read bit line metallization to be only metal 1 and coupled to the read portion of the cell, such as the read pass gate transistor RPG by a contact only, and with no intervening vias, the capacitance of the read bit line RBL, and the resulting access speed, are greatly improved over the layout of a conventional bit cell.

Figure 8:
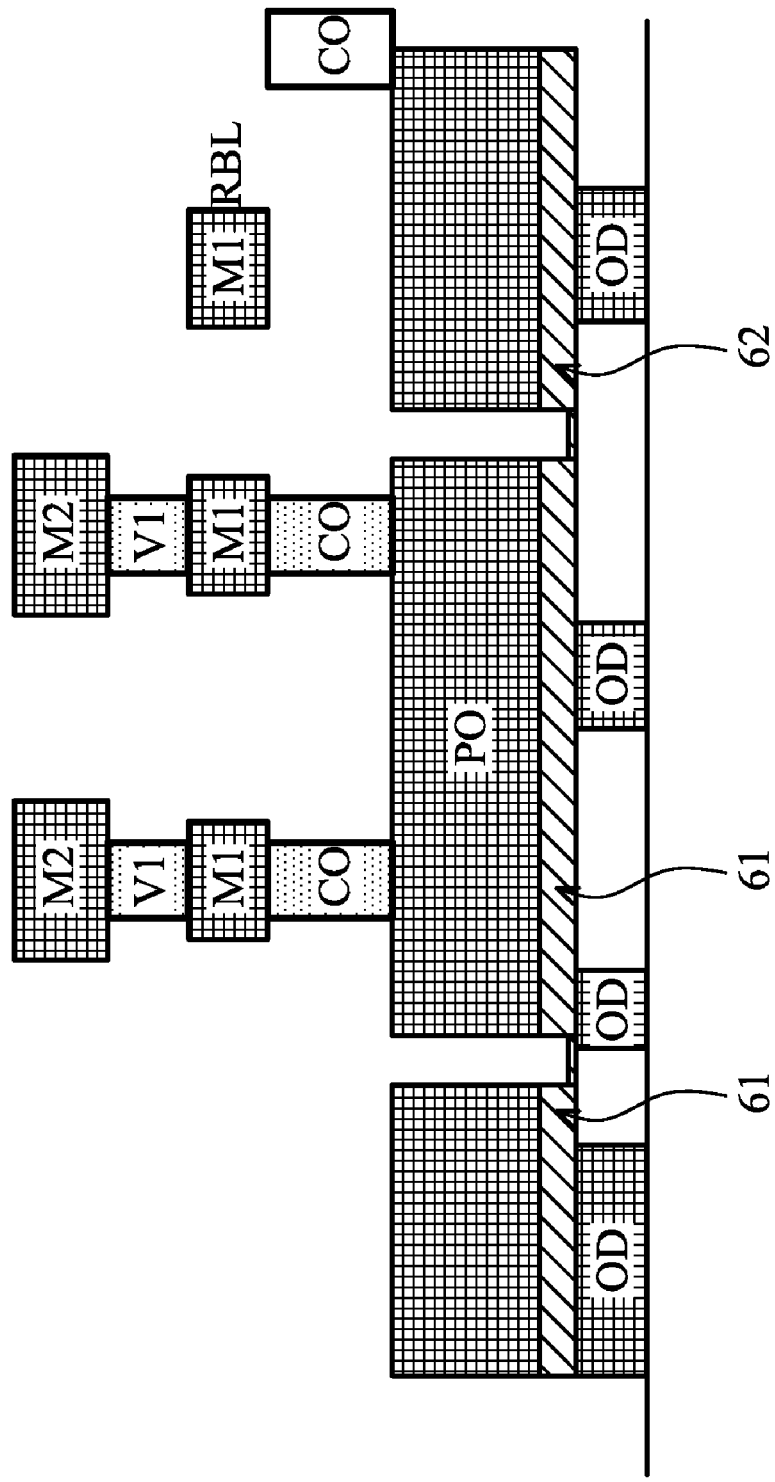
FIG. 8 illustrates a cross-sectional view taken in the plan view of the exemplary embodiment of FIG. 7.

FIG. 8 depicts the cross-sectional view of the layout of FIG. 7 taken along the line 8-8'. In FIG. 8, the active areas defined by isolation oxides are labeled OD. Overlying the active areas in the 6T bit cell region is gate dielectric 61 of a first thickness. Overlying the active area in the read portion is gate dielectric layer 62, the thinner gate dielectric, of a second thickness. The ratios of the thinner gate dielectric to the thicker gate dielectric may be one of many variations that are contemplated as embodiments. The thinner gate dielectric material may have a thickness that is 0.75-0.99 of the thicker dielectric thickness; more preferably the ratio may be from 0.85-0.99, from 0.85-0-0.95, and more preferably 0.85-0.90. Other ranges may include from 0.75-0.95, from 0.75-0.90, and from 0.75-0.80. This thinner dielectric in the read portion is significantly advantageous as it allows the read portion transistors to switch at a higher speed, and to operate with a lower Vcc,min. This is especially significant for the read portion of the 8T circuit. The thicker dielectric provided in the 6T storage cell portion is important for the cell stability, and provides lower standby leakage current Isb of the write portion of the SRAM cell which includes the storage nodes. The combination of the two different dielectric thickness NMOS transistors in a single SRAM bit cell provides significant power savings and performance advantages over the same cell when implemented in a conventional approach. Further, the power supplied to the 6T SRAM cell portion may be operated at a higher Vcc,min level than the thinner dielectric transistors of the read portion. Since read operations are much more frequent than writes, the read Vcc,min is more important. The lower Vcc,min level supplied to the 6T storage array improves stability and reliability of the storage portion of the circuit.

Further, the cross-sectional view in FIG. 8 illustrates the metal 1 read bit line RBL overlying the read portion of the circuit. Also, a single contact layer CO is shown between the metal 1 layer and the polysilicon gate of the read pass gate transistor RPG.

Figure 9:
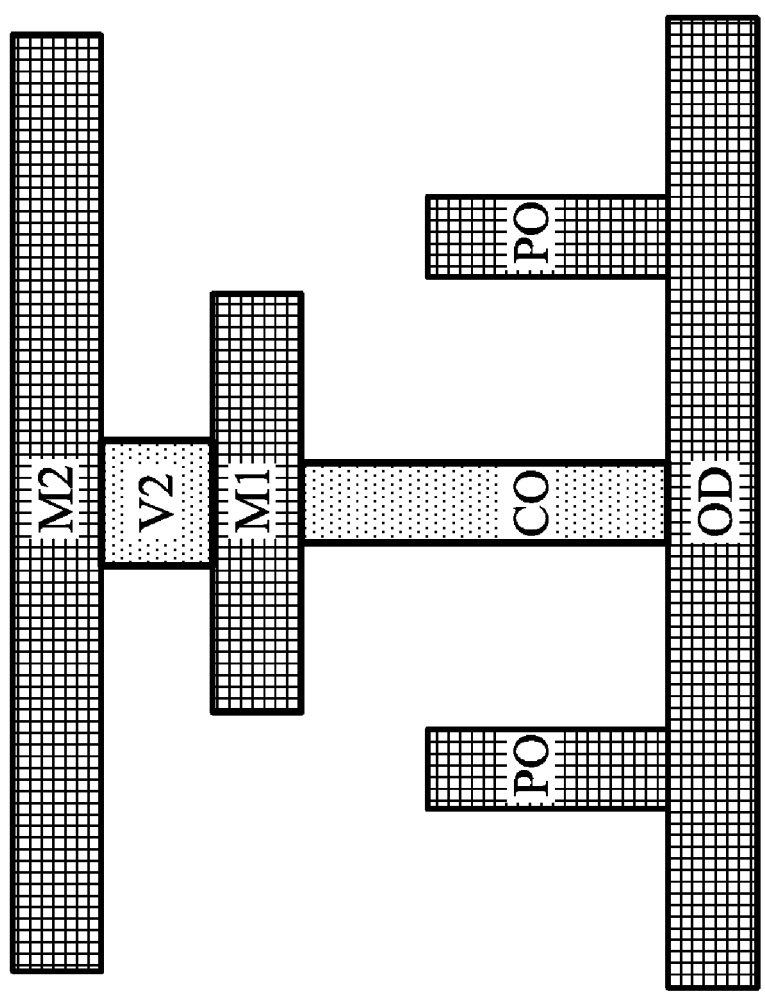
FIG. 9 illustrates in a cross-sectional view a read bit line connection using conventional circuit metallization techniques.

Additional figures are presented to better illustrate the advantages of the use of a single metal layer read bit line over the use of conventional 8T bit cell layout approaches. In FIG. 9, a cross-sectional view of a typical conventional lay out metal 2 read bit line, and the connectivity to the active area that would be required to couple the metal 2 read bit line to the read pass gate drain terminal, is shown. In the conventional arrangement, a metal 2 layer read bit line is coupled by a via 1 (vias over metal 1) to a metal 1 layer portion, which then is coupled by a contact portion CO, to a portion of the active area that would correspond to one terminal of the read pass gate (RPG) transistor. Thus, the capacitance path includes metal 2, a via in the V1 layer, metal 1, a contact portion CO and the contact resistance at the active area OD.

Figure 10:
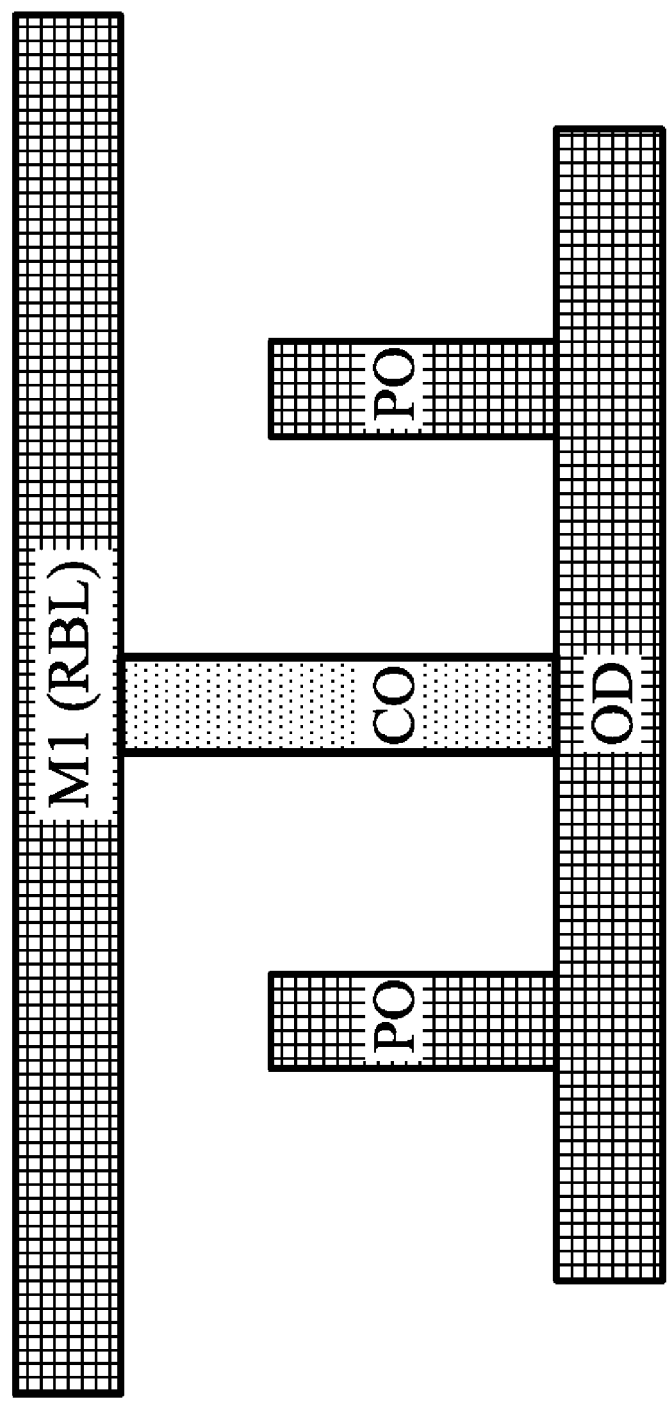
FIG. 10 illustrates in a cross-sectional view an exemplary embodiment read bit line connection incorporating features of the invention.

FIG. 10 illustrates the read bit line structure of an exemplary embodiment in a cross-sectional view. In FIG. 10, the metal 1 layer read bit line RBL is illustrated overlying and contacting a single contact CO which contacts the surface of the active area OD. Thus, the resistance path now includes only metal 1 M1, a single contact CO, and the contact resistance at the active area.

Figure 11:
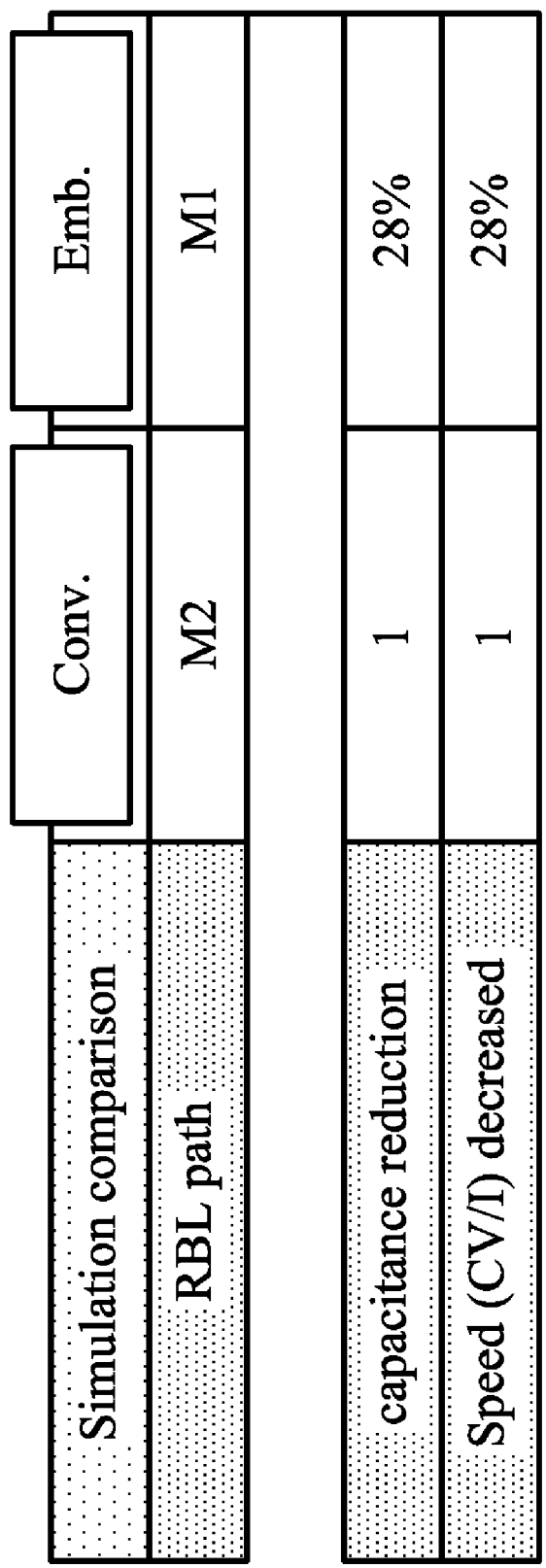
FIG. 11 illustrates in a table a simulation comparing the results obtained using the conventional read bit line metallization of FIG. 9 and comparing the results obtained using the embodiment of FIG. 10.

FIG. 11 illustrates a comparison of electrical simulation results obtained for a typical semiconductor process forming the connectivity arrangements of the conventional metal 2 read bit line of FIG. 9 and similar results obtained for the exemplary embodiment metal 1 structure of the present invention, for example as shown in FIG. 10. As the table of FIG. 11 shows, the exemplary embodiment structure had a 28% improvement in capacitance, and a corresponding increase in access speed, over the conventional approach.

Figure 12:
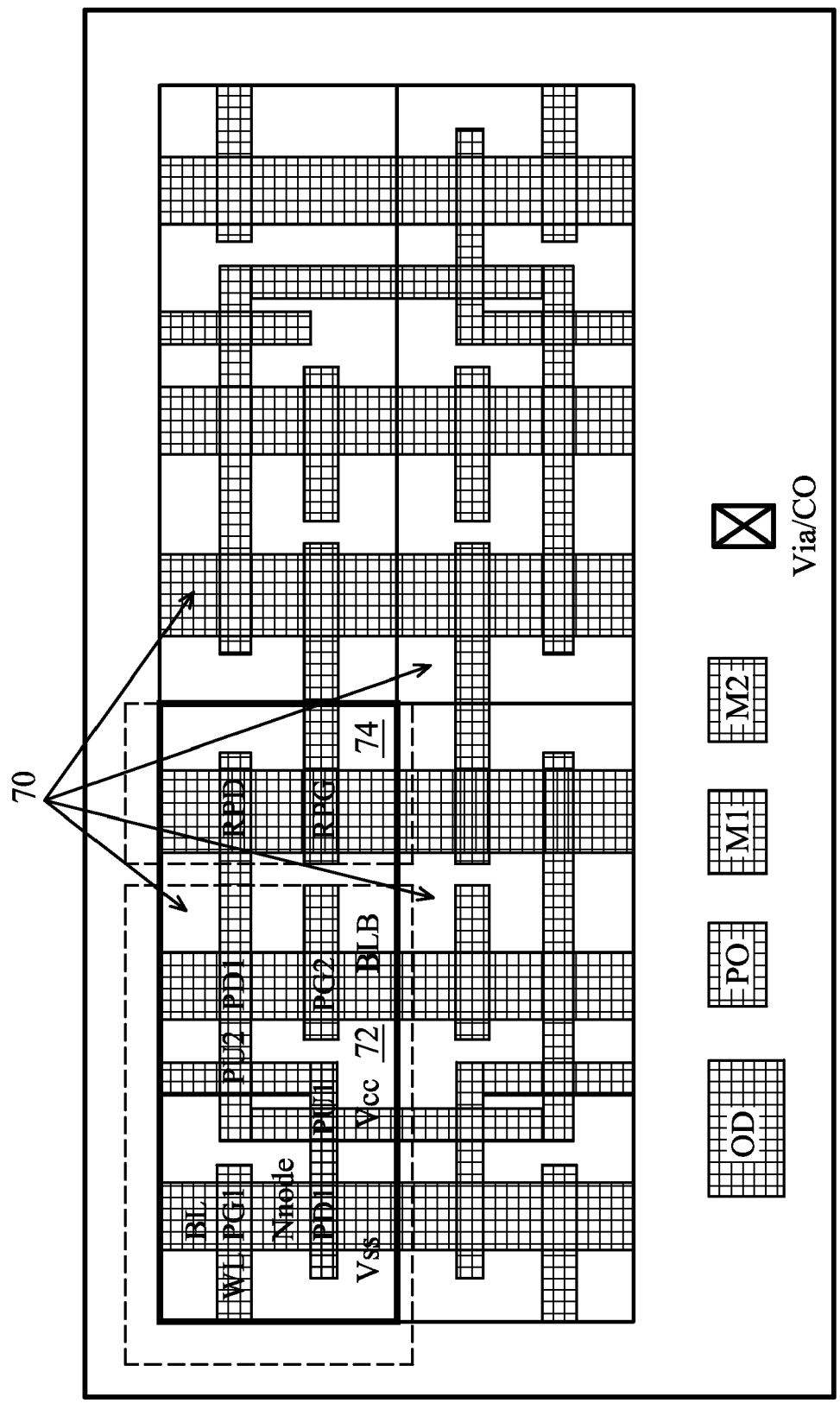
FIG. 12 depicts in a layout drawing an embodiment of an array of four 8T bit cells incorporating the features of the invention.

FIG. 12 depicts in a layout plan view an exemplary embodiment, an array of four of the 8T bit cells 70 arranged together. As can be seen in FIG. 12, the bit cells 70 may be efficiently packed together by folding them over vertically from left to right, and over horizontally from top to bottom. This arrangement results in placing the thinner gate dielectric devices RPD and RPG for each cell in a common area in the center of the array, while the thicker gate dielectric devices for the 6T storage cell share active areas OD and are formed at each end of the array. When performing the process for dielectric deposition steps, it is relatively easy to isolate areas using photomask and photoresist techniques. In a simple implementation, the process may perform gate dielectric deposition first in one area, and then in another, to form the two different gate dielectric thicknesses.

Also, as an alternative arrangement that forms another exemplary embodiment, instead of a thicker dielectric in a portion of an SRAM array and a thinner dielectric in a read portion of the same array, two different gate dielectrics having higher and lower dielectric constants may be used. The higher dielectric constant layer may be used in the 6T storage cells to provide higher stability and lower standby leakage current, while the lower dielectric constant layer may be used in the read portion of each bit cell, to provide a lower Vcc,min, and faster speed, in those portions. The use of the metal 1 read bit line layer for the read portions, in combination with the additional two thicknesses of the gate dielectric layer, forms additional alternative embodiments that provide additional performance advantages over the conventional approaches.

Figure 13:
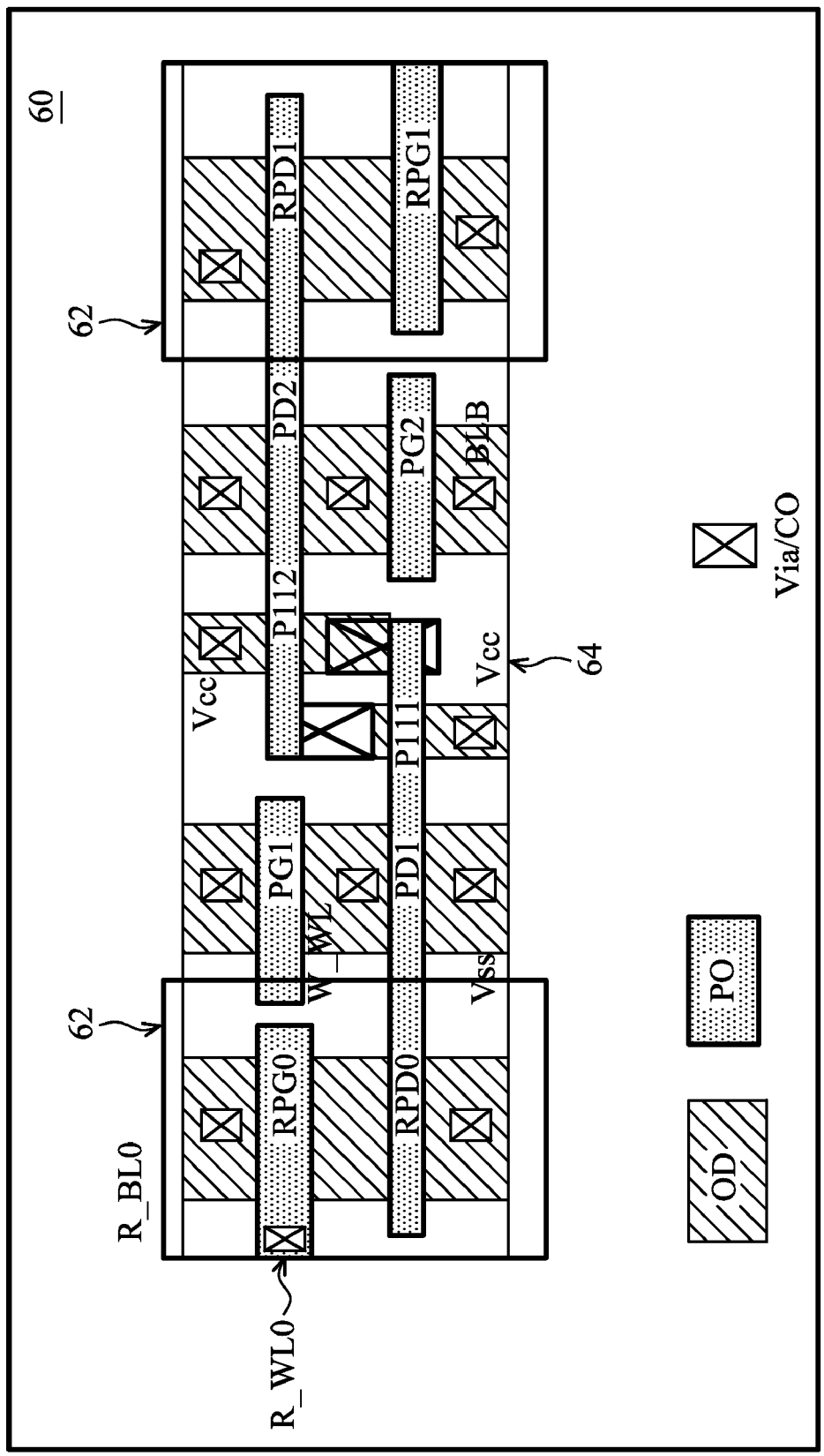
FIG. 13 illustrates in a layout view an exemplary 10T bit cell incorporating the features of the invention.

FIG. 13 illustrates an exemplary layout for a 10T bit cell 60. In FIG. 13, a layout portion 64 is shown that is very similar to the layout for the 6T bit cell presented above. The 10T cell additionally has two read ports, one located at each end of the cell, and each is very similar to the read port of the 8T bit storage cell presented above. The gate dielectric thickness in the portions 62 is made thinner than the gate dielectric in portion 64, as described above with respect to the 8T bit cell, the read transistors are formed to be faster and have a lower Vt than the write portion transistors.

Figure 14:
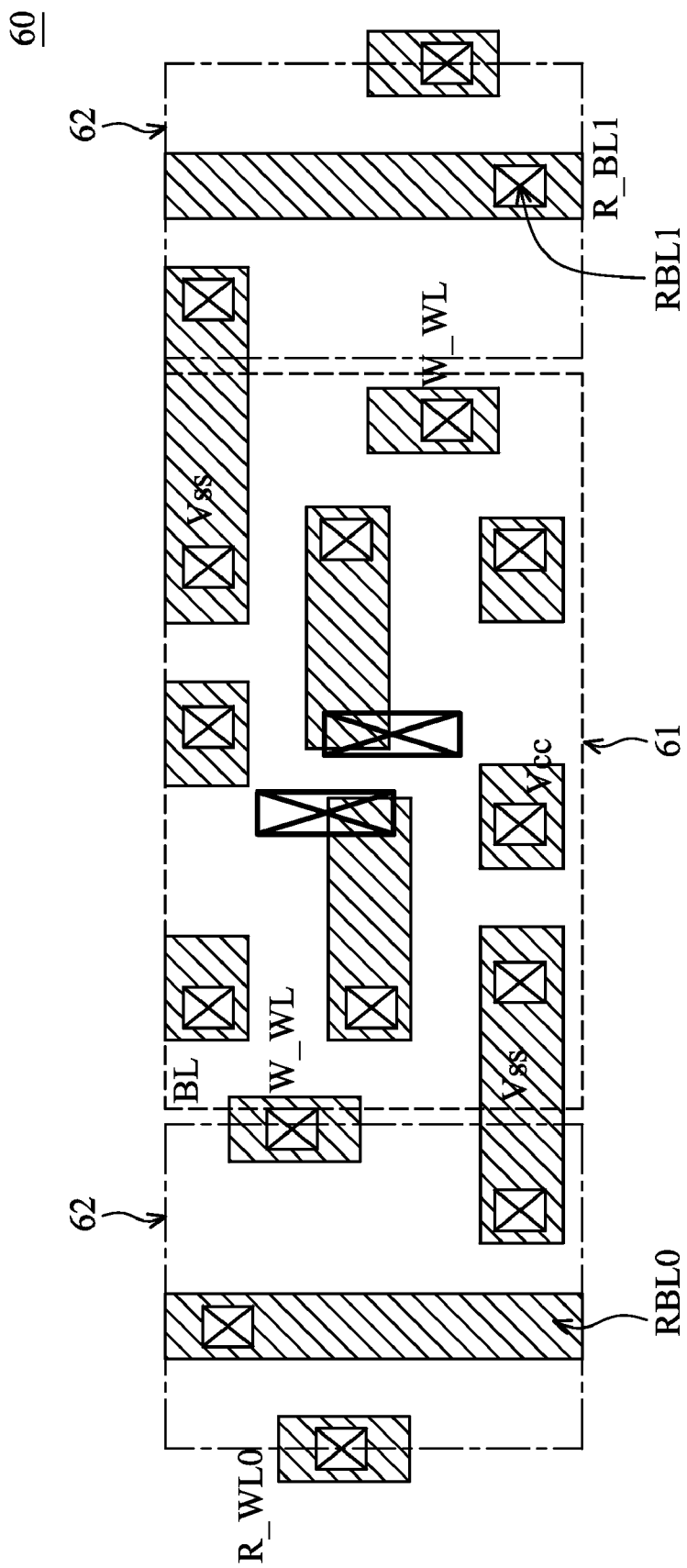
FIG. 14 illustrates in a layout view the metal 1 layer for the embodiment of FIG. 13.

FIG. 14 depicts the metal 1 (M1) layout for the 10T cell corresponding to the layout illustrated in FIG. 13. In FIG. 14, the metal one (M1) read bit lines RBL0 and RBL1 are visible at each end of the 10T cell. As described above, by restricting the metal 1 read bit lines for the read portion to be spaced from the cell by only a contact, and not by any intervening vias, the capacitance in the read path is reduced and the SRAM cell read times are improved.

Figure 15:
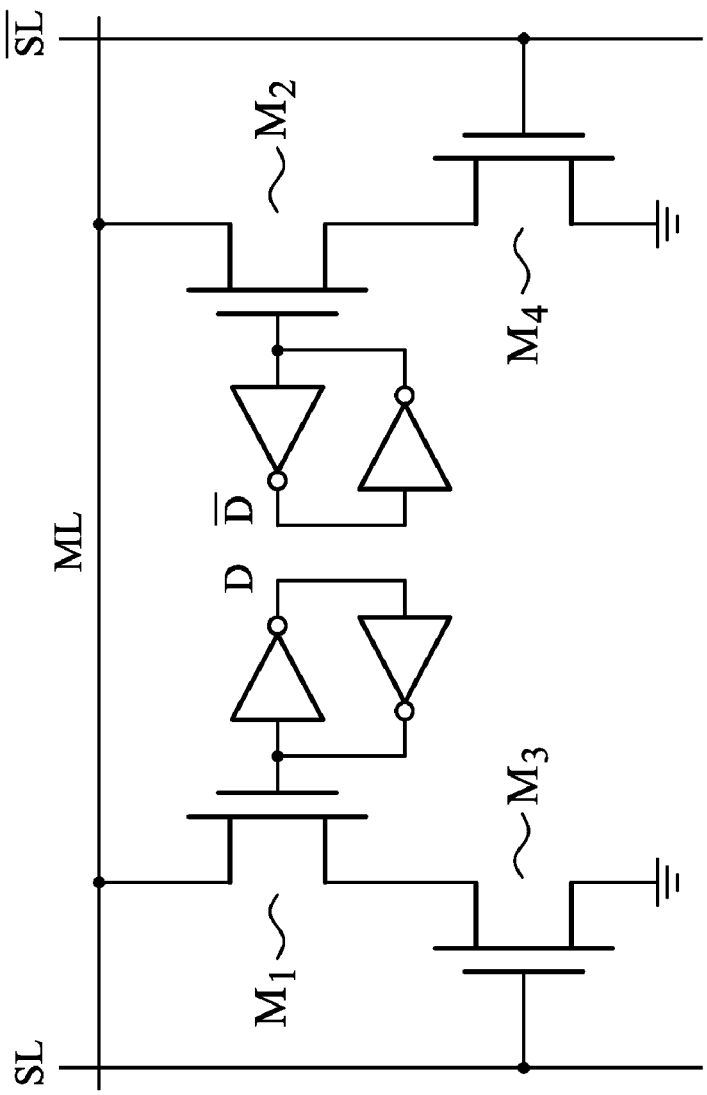
FIG. 15 illustrates in a circuit schematic a content addressable memory bit cell.

FIG. 15 depicts a bit cell arrangement that may also benefit from the use of the embodiments. A content addressable memory (CAM) cell 73 is shown. CAM cells are selected by presenting the data word to the memory, and the memory returns the addresses where a matching data word is found. The circuit has 6T transistors and from a layout and transistor point of view, is very similar to the 6T SRAM cell. In FIG. 15, the CAM cell has a pair of complementary select lines SL and SL that will act similar to the read bit lines RBL in the SRAM arrays, and an output line ML. Each side of the CAM cell 73 has a pair of inverters that are formed of two pull up (PMOS) and two pull down (NMOS) devices that are coupled to maintain data at a storage node. Each side of the CAM cell 73 also has a read pull down transistor, an NMOS M3 or M4, and a select gate transistor, NMOS M1 or M2. Thus, one skilled in the art will recognize that the same features of the SRAM 10T bit cell are present in the CAM cells, a storage portion formed of pull up and pull down transistors coupled to latch data, and a read portion comprised of 2 NMOS transistors that are series coupled. Because of these similarities, the use of the thicker gate oxide in the storage inverter portion, and the use of the thinner gate oxide devices in the transistors M1, M2, M3, and M4 have benefits similar to those for the SRAM bit cell applications described above.

Figure 16:
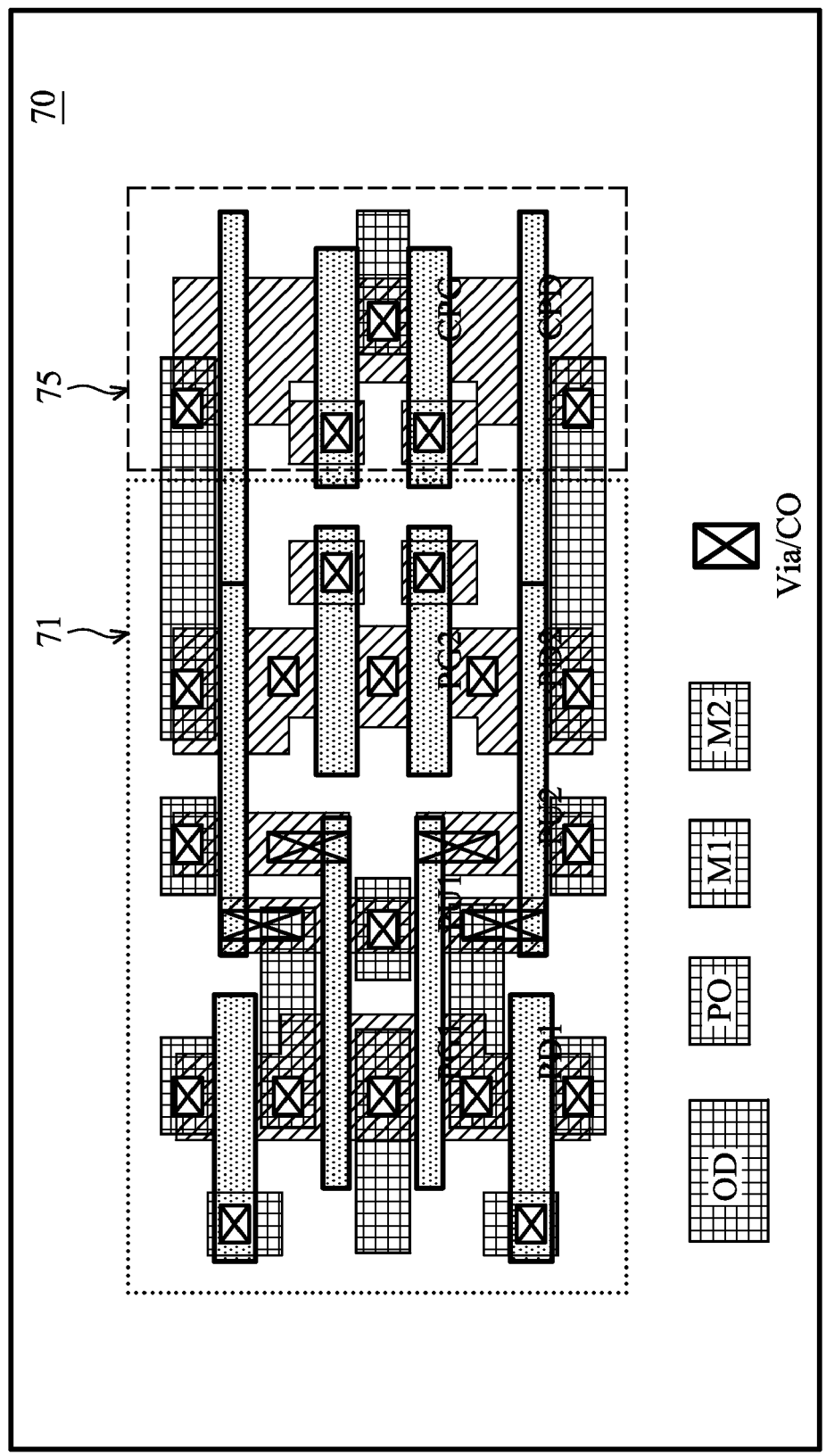
FIG. 16 depicts in a layout view an exemplary embodiment of a CAM cell incorporating features of the invention.

FIG. 16 depicts the active areas OD, the polysilicon conductors PO and the metal 1 M1 and contacts CO for an example layout for the CAM cell 73 of FIG. 15. The gate conductors for the read transistors M1, M2, M3, and M4 of FIG. 15 are shown in the right portion, 75. As for the 10T cell and the 8T cells described above, in this embodiment, the read portion 75 has transistors with thinner gate dielectrics or a thinner equivalent oxide thickness than that of the write and storage portion 71. The storage portion 71 has NMOS transistors with thicker gate dielectrics or, in an alternative embodiment, a thicker equivalent oxide thickness. The advantages obtained by this arrangement are similar to those described above for the SRAM bit cells, faster read times, lower standby leakage current, and improved Vcc,min.

Figure 17:
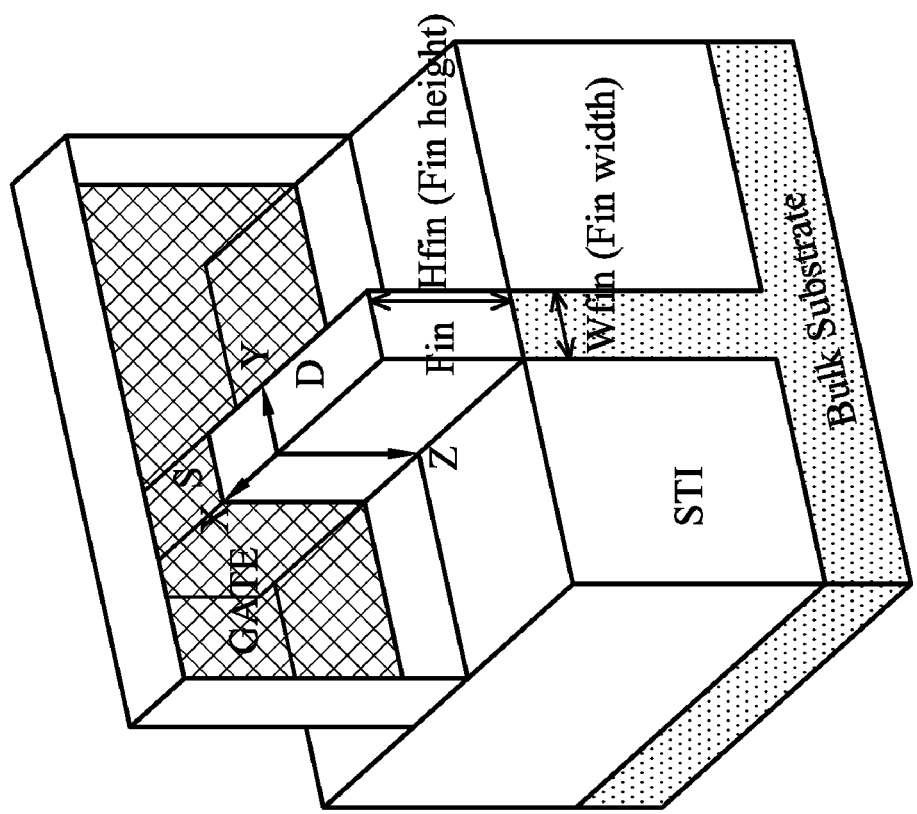
FIG. 17 depicts in a three dimensional view a finFET transistor device.

The embodiments described above are directed to a discussion of the SRAM bit cells using planar MOS transistors. In still other alternative exemplary embodiments that are also contemplated as part of the invention herein, multiple gate transistors, such as finFETs, may be used for portions of the circuits. A three dimensional illustration of a finFET device 80 is depicted in FIG. 17. The finFET is formed on a semiconductor fin that contains the source, drain, and LDD diffusions to form the channel and source and drain terminals of the MOS device. The gate dielectric may be formed over the vertical sides (forming a dual gate device) or over the entire exposed fin surface (forming a triple gate device). By extending the gate width over the height and width of the fin, the device can be made with a larger W/L ratio, without consuming silicon area. Multiple fin devices may be formed and coupled together to increase the size of the transistors, as well. A gate conductor is formed, typically perpendicular to and intersecting the fin, and overlying the gate dielectric, to complete the gate structure for the MOS device.

Figure 18:
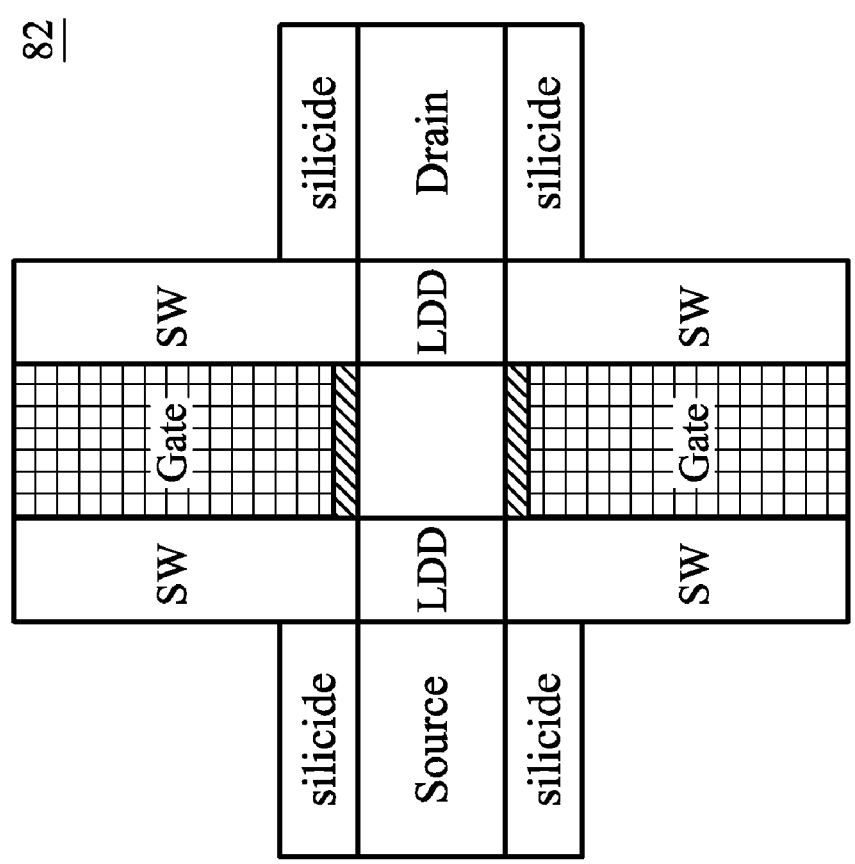
FIG. 18 depicts a cross-section of the finFET transistor of FIG. 17.

In FIG. 18, a cross-section of the finFET 80 of FIG. 17 is depicted. The gate (polysilicon or other known gate conductor material) is depicted with insulator sidewalls SW. The fin contains the source and drain implants and the lightly doped drain diffusions and has silicide formed over the doped regions. Note that when the finFET is used with the larger size per silicon area, the gate dielectric may be the same thickness, or a different thickness than planar transistors used in the embodiment. This is true because the finFET has higher performance than the planar transistors of the same silicon area.

Figure 19:
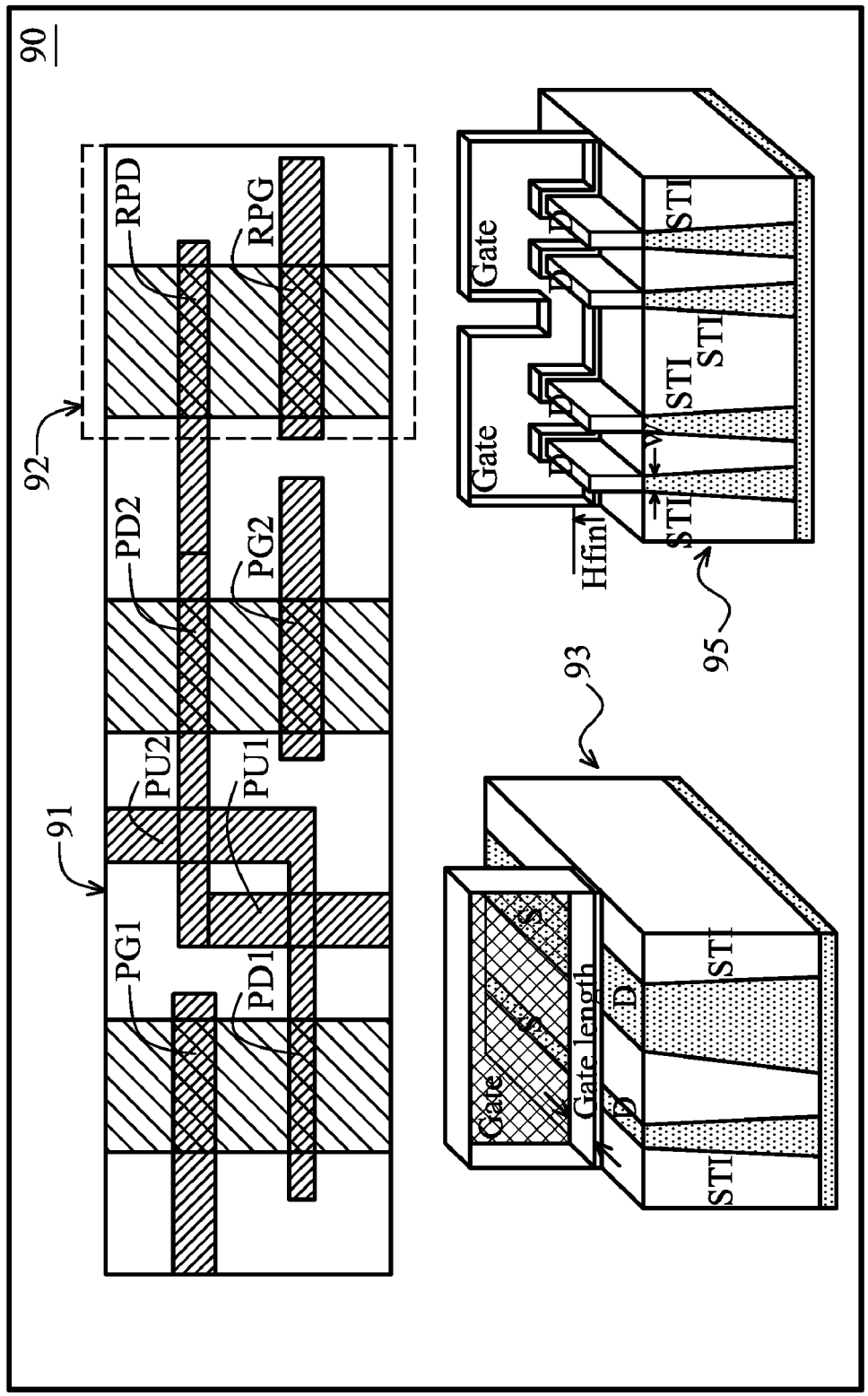
FIG. 19 depicts an exemplary embodiment of an 8T SRAM cell having a read portion implemented using finFET transistors, and another portion implemented using planar transistors.

In FIG. 19, an exemplary embodiment of the dual port 8T bit cell is depicted and the drawing illustrates how the finFET may be used to enhance the performance of the bit cell. Layout 90 illustrates the active area, and polysilicon gates, for an 8T SRAM cell as shown above. Area 91 is the storage node and write portion, and area 92 is the read port. While in the embodiments above, planar transistors were provided with thicker gate dielectrics in the write portion, and thinner gate dielectrics for faster read times in the read portion; in this exemplary embodiment, the read port transistors RPG and RPD are formed as finFET devices 95. In this manner, the advantages of a faster read access and lower Vcc,min, etc. may be obtained by using, in a single SRAM bit cell, two different transistor types: a planar MOS type 93 for the storage node transistors and write portion 91, and finFET transistors 95 for the read port of the 8T bit cell.

Of course this non-limiting embodiment may be further extended to the 10T SRAM bit cell, and to the CAM bit cells, as described above. The use of the finFETs may be provided with a uniform gate dielectric thickness and using the same gate dielectric material as the planar transistors. Further, the finFET embodiments may be advantageously formed in an SOI layer, as the silicon fins extend vertically above the surface and the source and drain regions are formed in the fins themselves.

Additional alternative embodiments include the use of different thickness gate dielectrics in the finFET devices, as compared to the planar MOS devices. Further, additional embodiments include using high k dielectrics in one of the planar MOS devices, the finFET devices, or both. In addition, the finFET devices may be dual gate, triple gate, or multiple gate and may include multiple fins as shown in FIG. 19, but a single fin device is also contemplated as an exemplary embodiment of the invention.

In an exemplary embodiment, an apparatus is provided comprising a semiconductor substrate; at least one 8T SRAM bit cell having dual gate oxide thickness NMOS transistors and a read port.

In another exemplary embodiment, an integrated circuit device is provided, comprising: a semiconductor substrate; at least one 8T SRAM bit cell having dual gate oxide thickness NMOS transistors and a read port, and a layout is provided where the read bit line for the read port is restricted to a first level of metallization over an interlevel dielectric, with no intervening vias, thus providing an additional performance advantage in conjunction with the dual gate oxide SRAM bit cell.

In another exemplary embodiment, an integrated circuit device is provided, comprising: a semiconductor substrate; at least one 10T SRAM bit cell having dual gate oxide thickness NMOS transistors and dual read ports. The NMOS transistors in the dual read ports each have an oxide thickness that is thinner than the oxide thickness in the storage cell transistors.

In another exemplary embodiment, a layout is provided with a 10T SRAM bit cell that has dual gate oxide thicknesses, where the read bit line for each of the dual read ports is restricted to a first level of metallization over an interlevel dielectric with no intervening vias, thus providing an additional performance advantage in conjunction with the dual gate oxide 10T SRAM bit cell.

In another exemplary embodiment, a method is provided comprising defining an 8T SRAM bit cell layout on a semiconductor substrate; forming a 6T SRAM portion with six transistors including two NMOS pass gates and two NMOS pull down transistors in a portion of an SRAM bit cell area; forming a read port including one NMOS pass gate and one NMOS pull down transistor in the read portion of the bit cell area; the gate oxide thickness for the four NMOS transistors in the 6T bit cell portion being thicker than the gate oxide thickness of the two transistors in the read portion; and forming a first metal level read bit line lying over and contacting the read portion without any intervening vias to provide reduced capacitance and increased performance.

In yet another exemplary embodiment, a method is provided comprising defining a 10T SRAM bit cell layout on a semiconductor substrate; including forming a 6T SRAM storage cell portion with six transistors including two NMOS pass gates and two NMOS pull down transistors in a portion of the SRAM bit cell layout area; forming two read ports each including one NMOS pass gate and one NMOS pull down transistor in first and second read portions of the bit cell area; the gate oxide thickness for the four NMOS transistors in the 6T bit cell portion being thicker than the gate oxide thickness of the transistors in each of the read portions; and forming a respective first metal level read bit line lying over and contacting each of the two read portions without any intervening vias, to provide reduced read bit line capacitance and increased performance.

In an alternative exemplary embodiment, an SRAM bit cell with transistors having two different gate dialectic materials is provided. A storage cell and write portion of an SRAM bit cell in an 8T configuration is provided a gate dielectric with a first equivalent oxide thickness value. A read portion of the 8T SRAM bit cell is provided a second gate dielectric with a lower equivalent oxide thickness value. In alternative embodiments, one of these gate dielectrics may be an oxide. In alterative embodiments, one of these gate dielectrics may be a high k gate dielectric material. In additional exemplary embodiments, a read bit line is formed in a first metal layer and coupled to the read portion of the 8T SRAM cell using only a contact and without any intervening metal layers or vias.

In another alternative embodiment, CAM bit cells are provided having a first storage node portion and a second read portion. In an exemplary CAM bit cell embodiment, the storage node portion comprises transistors having a first thicker gate dielectric and the read portion comprises transistors having a second, thinner gate dielectric material. In an alternative embodiment, the CAM bit cells are provided with a read bit line formed in a first metal layer and coupled to the read portion by a contact and without any intervening vias or intervening metal layers. In another alternative embodiment, CAM bit cells are formed with transistors in the read portion formed of multiple gate transistors. In yet another embodiment, CAM bit cells are formed with transistors of high k gate dielectric and another dielectric.

In another arrangement of a high speed bit cell, an 8T SRAM bit cell, 10T SRAM bit cell, or CAM cell is provided having two portions, a bit cell storage portion and a read portion. In a storage portion, planar CMOS transistors are provided. In a read portion, finFET transistors are provided. The read portion transistors provide advantages in a higher operating speed for the read portion. The finFET transistors may include, as a non-limiting example, dual gate, triple gate and multiple gate cells.

In an alternative embodiment, the SRAM bit cells, whether 8T, 10T or other, or CAM bit cells, are provided on an epitaxially formed silicon over insulator (SOI) layer. In this embodiment, the features of any of the other embodiments may be used. That is, in one exemplary embodiment, an 8T bit cell is provided with a write portion having storage nodes and a read portion formed in an SOI layer. The write portion has transistors having a first gate dielectric thickness. The read portion has transistors having a second, thinner gate dielectric thickness. In alternative embodiments, the write portion has high k gate dielectric materials with a first equivalent oxide thickness. The read portion may have high k gate dielectric materials with a second equivalent oxide thickness that is lower than the first. As yet another alternative, the read portion may have an oxide dielectric while the write portion has a high k gate dielectric, or vice versa. In yet another embodiment, the gate dielectrics in the write portion and the read portion may have the same thickness, yet be formed of different material. In yet another embodiment, the write portion may have a first transistor type while the read portion has a second transistor type. In a non-limiting example of this SOI cell, the second transistor type may be a finFET transistor.

Although exemplary embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
a semiconductor substrate; and
at least one SRAM bit cell formed in a portion of the semiconductor substrate;
wherein the at least one SRAM bit cell further comprises a first 6T storage cell comprising NMOS transistors having a first gate dielectric thickness and a read port comprising NMOS transistors having a second thinner gate dielectric thickness;
wherein the second thinner gate dielectric thickness is greater than 75% and less than 99% of the first gate dielectric thickness.

2. The apparatus of claim 1, wherein the second thinner gate dielectric thickness is greater than 85% and less than 95% of the first gate dielectric thickness.

3. The apparatus of claim 1, wherein the second thinner gate dielectric thickness is greater than 85% and less than 90% of the first gate dielectric thickness.

4. The apparatus of claim 1, wherein the SRAM bit cell is one selected from the group of an 8T SRAM bit cell and a 10T SRAM cell.

5. The apparatus of claim 1, wherein the SRAM bit cell comprises at least one finFET transistor.

6. The apparatus of claim 1, further comprising:
first and second metal layers disposed over the substrate and being separated by intervening interlevel dielectric layers, coupling at least some of the transistors of the SRAM bit cell together; and
a read bit line formed in the first metal layer that overlies the substrate with no intervening metal layers, coupled to the read port of the SRAM bit cell using a contact and without any intervening metal layer to metal layer vias.

7. The apparatus of claim 1, wherein:
the SRAM bit cell is one selected from the group of an 8T SRAM bit cell and a 10T SRAM cell; and
the read port comprises at least one finFET transistor.

8. The apparatus of claim 1, wherein the first and second gate dielectrics further comprise silicon oxide.

9. The apparatus of claim 1, wherein at least one of the first thicker gate dielectric and second thinner gate dielectric comprise a high k dielectric.

10. The apparatus of claim 1, wherein the first thicker gate dielectric and second thinner gate dielectric comprise a dielectric selected from the group of silicon oxide, silicon dioxide, silicon nitride, and silicon oxynitride.

11. An integrated circuit, comprising:
a logic portion formed in a first portion of a semiconductor substrate and having transistors, including some transistors having gate dielectrics of a thin gate dielectric; and
an SRAM array comprising:
a plurality of SRAM bit cells, each comprising:
an SRAM bit cell formed in a second portion of the semiconductor substrate; and
the SRAM bit cell further comprising transistors having a thicker gate dielectric and additional transistors coupled to the thicker gate dielectric transistors and having the thin gate dielectric;
wherein the thin gate dielectric has a thickness that is less than 95% of the thickness of the thicker gate dielectric.

12. The integrated circuit of claim 11, wherein the thin gate dielectric thickness is between 75% and 99% of the thicker gate dielectric thickness.

13. The integrated circuit of claim 11, wherein the SRAM bit cell comprises a first 6T storage cell of NMOS transistors having the thicker gate dielectric; and further comprising a read port of NMOS transistors having the thin gate dielectric.

14. The integrated circuit of claim 13, wherein the SRAM bit cells each further comprise:
first and second metal layers disposed over the SRAM array and being separated from the SRAM array and from one another by intervening interlevel dielectric layers, and coupling at least some of the transistors of the SRAM bit cells together; and
a read bit line formed in the first metal layer that overlies the SRAM array with no intervening metal layers, coupled to the read portion of the SRAM bit cells without any intervening metal layer to metal layer vias.

15. An apparatus, comprising:
a semiconductor substrate;
at least one content addressable memory (CAM) bit cell formed in a portion of the semiconductor substrate;
a logic portion formed in a first portion of the semiconductor substrate apart from the portion of the semiconductor substrate comprising the CAM bit cell and having transistors, the transistors including some having gate dielectrics of a thin gate dielectric;
wherein the CAM bit cell further comprises transistors having a first gate dielectric of a first thickness and additional transistors having a second thinner gate dielectric that is equal to the thin gate dielectric; and
wherein the second thinner gate dielectric has a thickness greater than 75% and less than 99% of the first gate dielectric thickness.

16. The apparatus of claim 15, wherein the portion of the semiconductor substrate comprising the at least one CAM bit cell further comprises a silicon on insulator (SOI) layer.

17. The apparatus of claim 15, wherein the CAM bit cell further comprises at least one finFET transistor.

18. The apparatus of claim 15, wherein the second thinner gate dielectric has a thickness greater than 85% and less than 95% of the first gate dielectric thickness.

* * * * *